United States Patent
Cambou

(10) Patent No.: US 10,175,949 B2
(45) Date of Patent: Jan. 8, 2019

(54) DATA COMPILER FOR TRUE RANDOM NUMBER GENERATION AND RELATED METHODS

(71) Applicant: Bertrand Cambou, Flagstaff, AZ (US)

(72) Inventor: Bertrand Cambou, Flagstaff, AZ (US)

(73) Assignee: Arizona Board of Regents acting for and on behalf of Northern Arizona University, Flagstaff, AZ (US)

( * ) Notice: Subject to any disclaimer, the term of this patent is extended or adjusted under 35 U.S.C. 154(b) by 0 days.

(21) Appl. No.: 15/697,370

(22) Filed: Sep. 6, 2017

(65) Prior Publication Data

US 2018/0067725 A1 Mar. 8, 2018

Related U.S. Application Data

(60) Provisional application No. 62/383,683, filed on Sep. 6, 2016.

(51) Int. Cl.
 *G06F 7/58* (2006.01)
 *H03K 19/21* (2006.01)
 *H03K 3/84* (2006.01)

(52) U.S. Cl.
 CPC ............... *G06F 7/588* (2013.01); *H03K 3/84* (2013.01); *H03K 19/21* (2013.01)

(58) Field of Classification Search
 CPC ........... G06F 7/588; H03K 19/21; H03K 3/84
 USPC .................................................. 708/232, 255
 See application file for complete search history.

(56) References Cited

U.S. PATENT DOCUMENTS

| 8,301,912 B2* | 10/2012 | Lin ...................... G06F 12/0246 713/193 |
| 8,525,169 B1 | 9/2013 | Edelstein et al. |
| 9,596,263 B1 | 3/2017 | Brooker |
| 2007/0273408 A1* | 11/2007 | Golic ...................... G06F 7/584 326/93 |
| 2012/0072737 A1 | 3/2012 | Schrijen et al. |

(Continued)

FOREIGN PATENT DOCUMENTS

| CN | 102521538 A | 6/2012 |
| CN | 104836669 A | 8/2015 |

(Continued)

OTHER PUBLICATIONS

Erdinc Ozturk et al., Physical Unclonable Function With Tristate Buffers, International Symposium on Circuits and Systems, IEEE International Symposium, May 2008, pp. 2-5.

(Continued)

*Primary Examiner* — Tan V Mai
(74) *Attorney, Agent, or Firm* — IPTechLaw

(57) ABSTRACT

Implementations of data compilers may include: a physical device including a physical parameter, the physical parameter including at least three states. The data compiler may also include a data stream generated from the physical parameter. The data stream may include a plurality of bits. Each bit may be coded with one of a 0, a 1, and an X; the 0, the 1, and the X may correspond with one of the at least three states of the physical parameter, respectively. The data compiler may also include an exclusive OR (XOR) data processor. The XOR processor may be configured to randomize the at least three states of the data stream and output a randomized output data stream.

20 Claims, 14 Drawing Sheets

(56) References Cited

U.S. PATENT DOCUMENTS

| | | |
|---|---|---|
| 2012/0284533 A1 | 11/2012 | Assche et al. |
| 2014/0126306 A1 | 5/2014 | Otterstedt et al. |
| 2014/0140513 A1 | 5/2014 | BrightSky et al. |
| 2014/0301551 A1 | 10/2014 | Adler et al. |
| 2015/0134947 A1 | 5/2015 | Varcoe et al. |
| 2015/0137380 A1 | 5/2015 | In't Zandt et al. |
| 2016/0048462 A1 | 2/2016 | O'Loughlin et al. |
| 2016/0335200 A1 | 11/2016 | Cambou |
| 2017/0010981 A1 | 1/2017 | Cambou |
| 2017/0046129 A1* | 2/2017 | Cambou ................ G06F 7/582 |

FOREIGN PATENT DOCUMENTS

| | | |
|---|---|---|
| JP | 2017004587 A | 1/2017 |
| KR | 101663544 B1 | 10/2016 |
| WO | 2017079704 A1 | 5/2017 |

OTHER PUBLICATIONS

Dai Yamamoto et al., Uniqueness Enhancement of PUF Responses Based on the Locations of Random Outputting RS Latches, Cryptographic Hardware and Embedded System, CHES 2011, pp. 390-406.

Juan Soto, Statistical Testing of Random No. Generators, National Institute of Standards & Technology—Paper, Dec. 1999, pp. 1-12.

George Marsaglia, Xorhift RNGs, Journal of Statistical Software, vol. 8, Issue 14, Jul. 4, 2003, pp. 1-6.

\* cited by examiner

| Case | % of X-cells | $\lambda_M$ Initial | $\lambda_M$ 2 XOR | $\lambda_M$ 3 XOR | $\lambda_M$ 4 XOR | $\lambda_M$ 5 XOR |
|---|---|---|---|---|---|---|
| Case-1 52%-48% | 2% | $2\,10^{-2}$ | $8\,10^{-4}$ | $3.2\,10^{-5}$ | $1.28\,10^{-6}$ | $5.12\,10^{-8}$ |
| Case-2 54%-46% | 4% | $4\,10^{-2}$ | $3.2\,10^{-3}$ | $2.56\,10^{-4}$ | $2.15\,10^{-5}$ | $1.64\,10^{-6}$ |
| Case-3 56%-44% | 7% | $6\,10^{-2}$ | $7.2\,10^{-3}$ | $8.64\,10^{-4}$ | $1.04\,10^{-4}$ | $1.2\,10^{-5}$ |
| Case-4 60%-40% | 11% | $1\,10^{-1}$ | $2\,10^{-2}$ | $4\,10^{-3}$ | $8\,10^{-4}$ | $1.6\,10^{-4}$ |
| Case-5 90%-10% | 100% | $4\,10^{-1}$ | $3.2\,10^{-1}$ | $2.38\,10^{-1}$ | $2.05\,10^{-1}$ | $1.64\,10^{-1}$ |

FIG. 8

| Case | % of X-cells | Objective: $\lambda_A < 5\ 10^{-8}$ Round $f$ of XOR | Objective: $\lambda_A < 1\ 10^{-10}$ Round $f$ of XOR |
|---|---|---|---|
| Case-1 52% - 48% | 2% | 5 | 7 |
| Case-2 54% - 46% | 4% | 7 | 9 |
| Case-3 56% - 44% | 7% | 8 | 12 |
| Case-4 60% - 40% | 11% | 10 | 14 |

FIG. 10

DATA COMPILER FOR TRUE RANDOM NUMBER GENERATION AND RELATED METHODS

CROSS REFERENCE TO RELATED APPLICATIONS

This document claims the benefit of the filing date of U.S. Provisional Patent Application 62/383683, entitled "Data Compiler for True Random Number Generation and Related Methods" to Bertrand Cambou which was filed on Sep. 6, 2016, the disclosure of which is hereby incorporated entirely herein by reference.

BACKGROUND

1. Technical Field

Aspects of this document relate generally to cryptographic operations. The cryptographic operations include applying exclusive OR (XOR) processing to arrays based on properties of physical devices to increase randomization of coding systems. More specific implementations involve XOR processing of 2-bit and 3-bit sequences.

2. Background

Conventionally, to provide security for telecommunications systems various codes or coding systems are used. These systems employ various cryptographic operations, which often involve applying various algorithms to encode data being transmitted across the telecommunications system using random numbers.

SUMMARY

Implementations of data compilers may include: a physical device including a physical parameter, the physical parameter including at least three states. The data compiler may also include a data stream generated from the physical parameter. The data stream may include a plurality of bits. Each bit may be coded with one of a 0, a 1, and an X; the 0, the 1, and the X may correspond with one of the at least three states of the physical parameter, respectively. The data compiler may also include an exclusive OR (XOR) data processor. The XOR processor may be configured to randomize the at least three states of the data stream and output a randomized output data stream.

Implementations of data compilers may include one, all, or any of the following:

The physical device may be one of a flash memory, electrically erasable programmable read-only memory (EEPROM), static random access memory (SRAM), dynamic random access memory (DRAM), random access memory (RAM), spin transfer-torque magnetic random access memory (STT-MRAM), and metal oxide resistive random access memory (ReRAM).

One of the at least three states of the physical parameter may change whenever a new measurement is made.

The XOR data processor may be implemented by one of a general purpose processor and an application specific integrated circuit (ASIC).

The XOR processor may include three or more logic gates.

The data compiler may further include a state machine coupled with the three or more logic gates and may be coupled with a secure processor.

Implementations of a method of generating a true random number may include: providing a physical device. The physical device including a plurality of cells. The method may include sorting the plurality of cells based on a state of a physical parameter, $\mathcal{P}$, into one of a 0 state, a 1 state, and an X state. The method may include generating a stream of states from the states of the plurality of cells, creating a stream of random numbers from the stream of states, grouping the stream of random numbers into one or more chunks of f bits, and generating a stream of true random numbers through randomizing the one or more chunks of f bits using an exclusive OR (XOR) processor.

Implementations of a method of generating a true random number may include one, all, or any of the following:

The physical device may be one of a flash memory, electrically erasable programmable read-only memory (EEPROM), static random access memory (SRAM), dynamic random access memory (DRAM), random access memory (RAM), spin transfer-torque magnetic random access memory (STT-MRAM), and metal oxide resistive random access memory (ReRAM).

The stream of random numbers may include $\{a_1, a_2, \ldots, a_i, \ldots a_n\}$.

The one or more chunks of f bits may include $\{a_{j1}, a_{j2}, \ldots, a_{ij}, \ldots, a_{jf}\}$ with f<n, where n is the number of bits in the stream of random bits.

The stream of true random numbers may include comprises $\{c_1, c_2, \ldots, c_j, \ldots, c_m\}$ where $c_i = a_{j1} \oplus a_{j2} \oplus \ldots \oplus a_{ij} \oplus \ldots \oplus a_{if}$ and n=mf.

The states of the physical parameter may change whenever a new measurement is made.

The XOR data processor may be implemented by one of a general purpose processor and an application specific integrated circuit (ASIC).

The XOR data processor may include three or more logic gates.

The method may further include a state machine coupled with the three or more logic gates coupled with a secure processor.

Implementations of a method of generating a true random number may include: providing a physical device. The physical device may include a plurality of cells. The method may also include sorting the plurality of cells based on a state of a physical parameter, $\mathcal{P}$, into one of a 0 state, a 1 state, and an X state. The X state may include a desired level of randomness based on the physical parameter, $\mathcal{P}$, and a first threshold, T1. The method may also include retesting all X states against the physical parameter, $\mathcal{P}$, identifying a second threshold, T2, changing the X states to one of 0 states and 1 states using the second threshold, T2, generating a stream or states from the states of the plurality of cells, extracting a data stream from the stream of states, and generating a stream of true random numbers through randomizing one or more chunks of f bits using an exclusive OR (XOR) processor.

Implementations of a method of generating a true random number may include one, all, or any of the following:

The physical device may be one of a flash memory, electrically erasable programmable read-only memory (EEPROM), static random access memory (SRAM), dynamic random access memory (DRAM), random access memory (RAM), spin transfer-torque magnetic random access memory (STT-MRAM), and metal oxide resistive random access memory (ReRAM).

At least one of the states of the physical parameter may change whenever a new measurement is made.

The XOR data processor may be implemented by one of a general purpose processor and an application specific integrated circuit (ASIC).

The XOR data processor may include three or more logic gates.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 8 is a table illustrating the level of randomness by experimental case using an implementation of a data compiler;

FIG. 10 is a table illustrating an implementation of a predictive tool for an implementation of a data compiler;

DESCRIPTION

Figure 1:
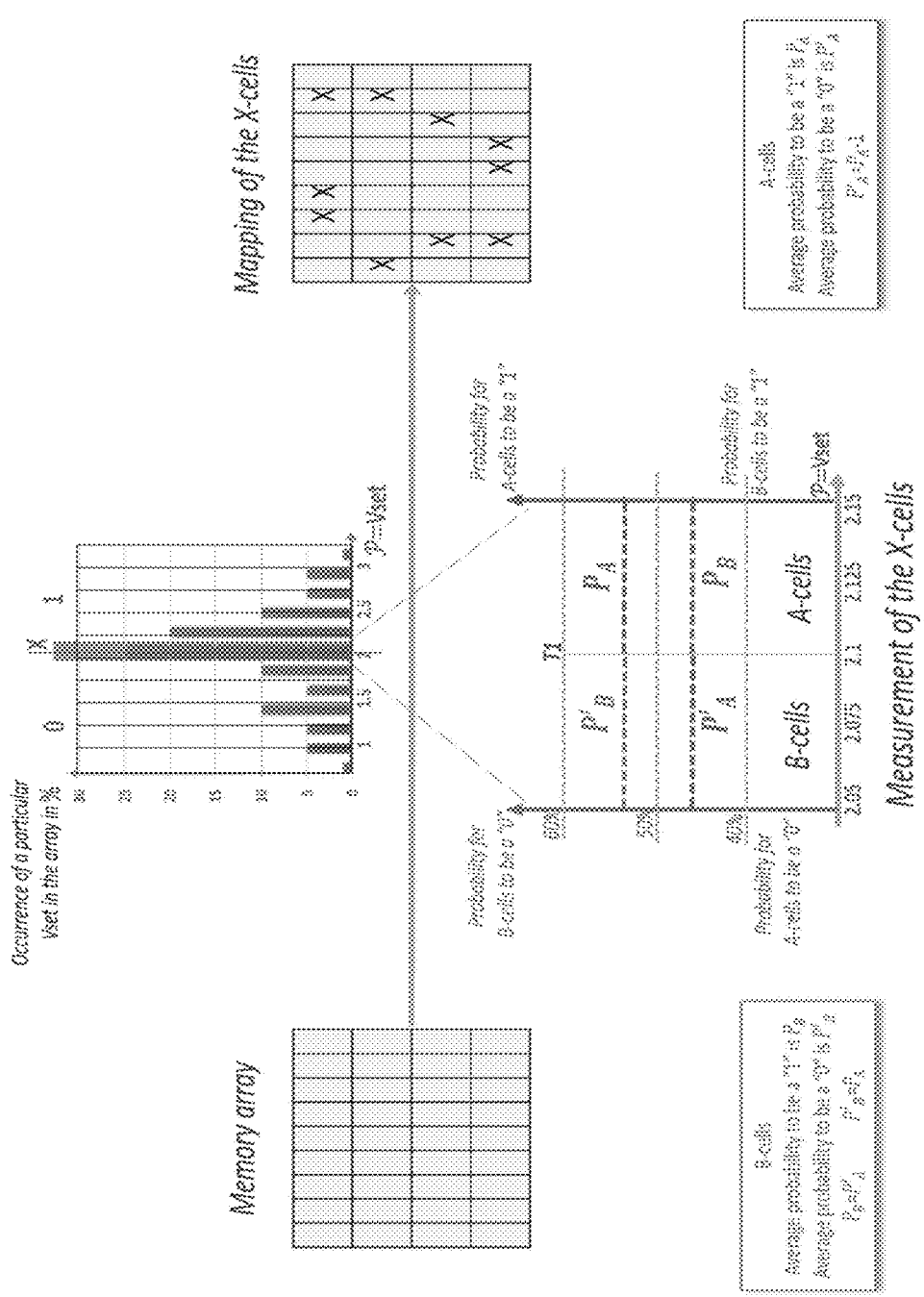
FIG. 1 is a schematic illustrating an overview of an implementation of the generation of X-cells.
Figure 2:
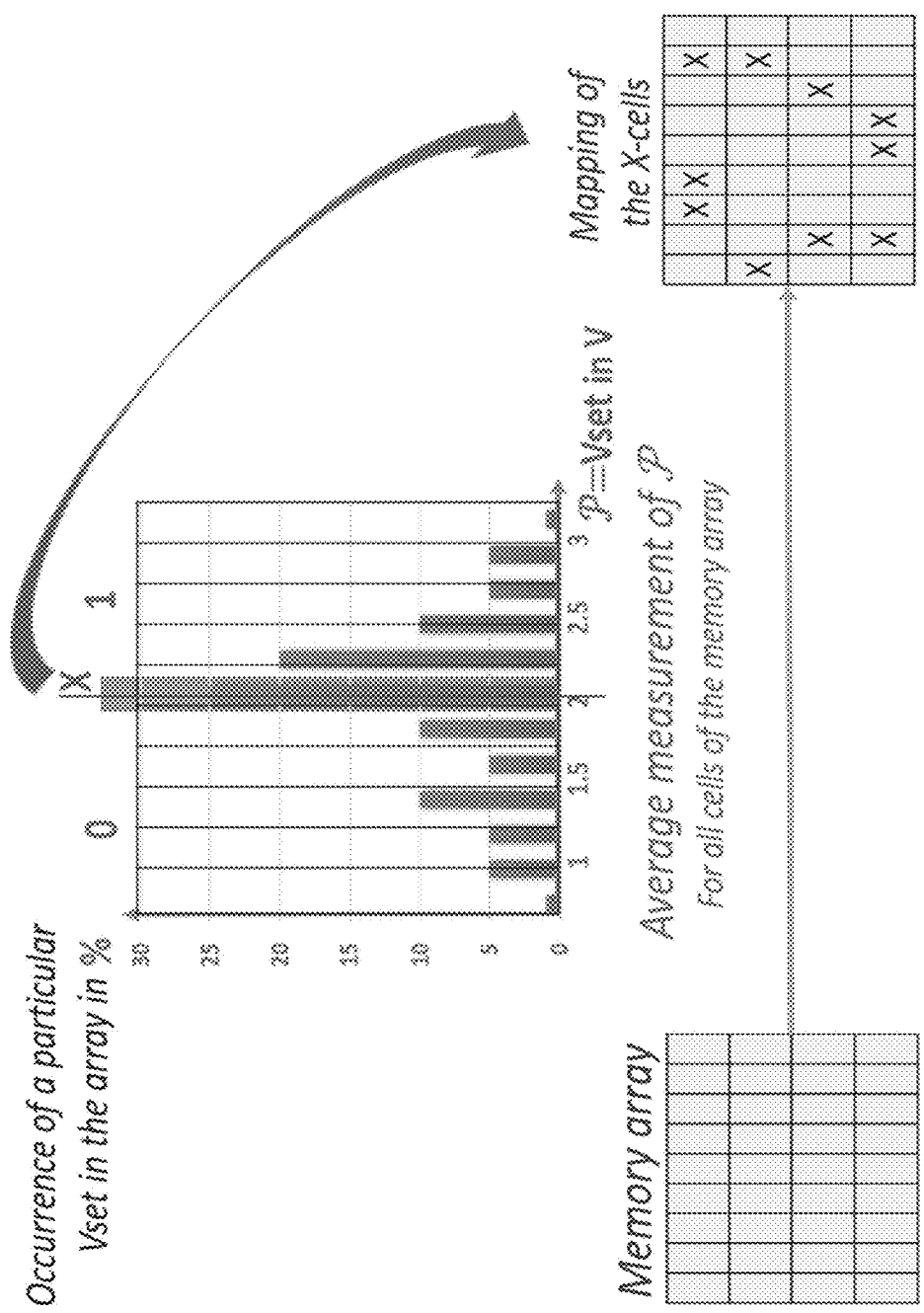
FIG. 2 is a schematic illustrating where the measurements of the X-cells correspond on the array in an implementation of the generation of X-cells.
Figure 3:
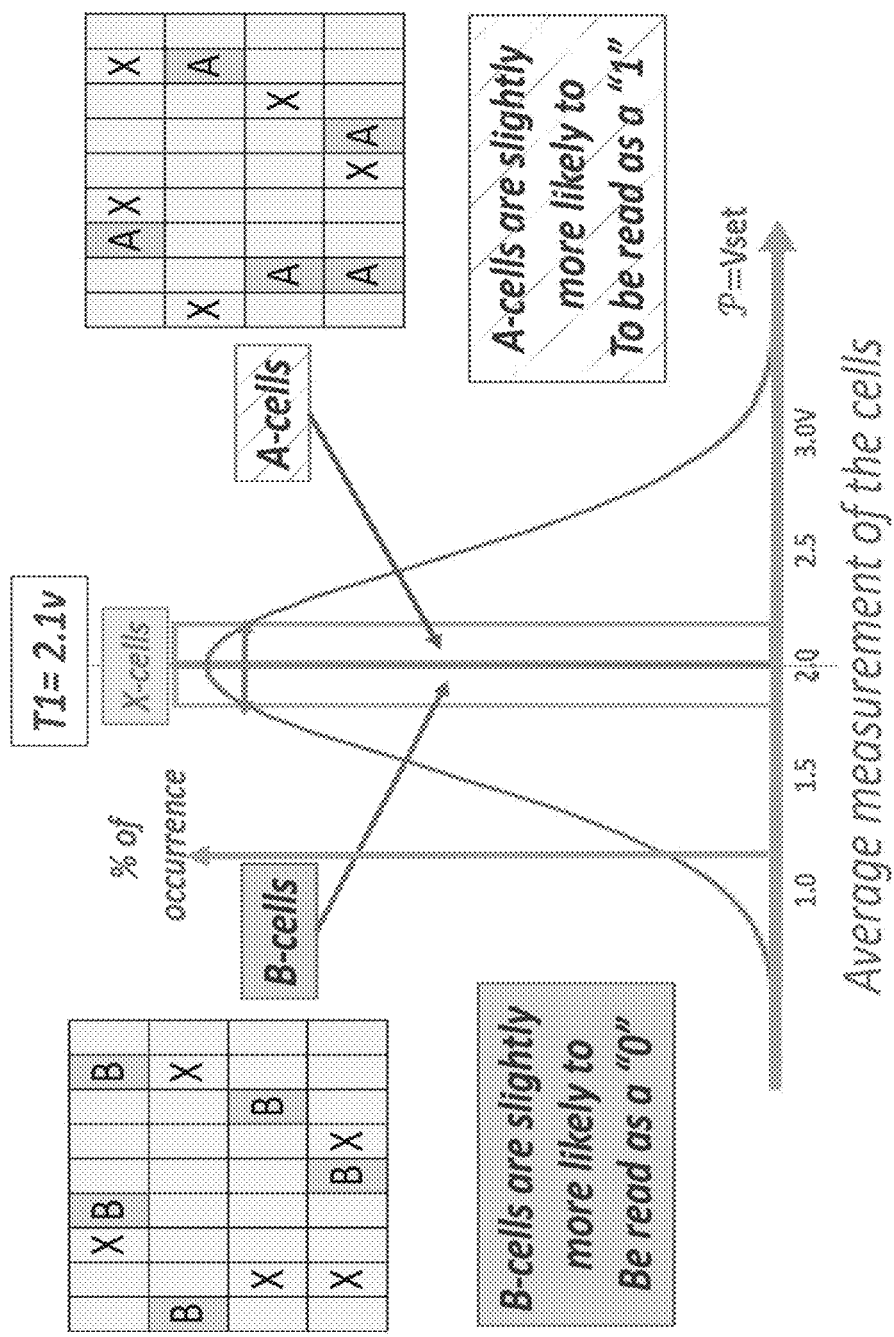
FIG. 3 is a schematic illustrating average measurement of the cells in an implementation of the generation of X-cells.
Figure 4:
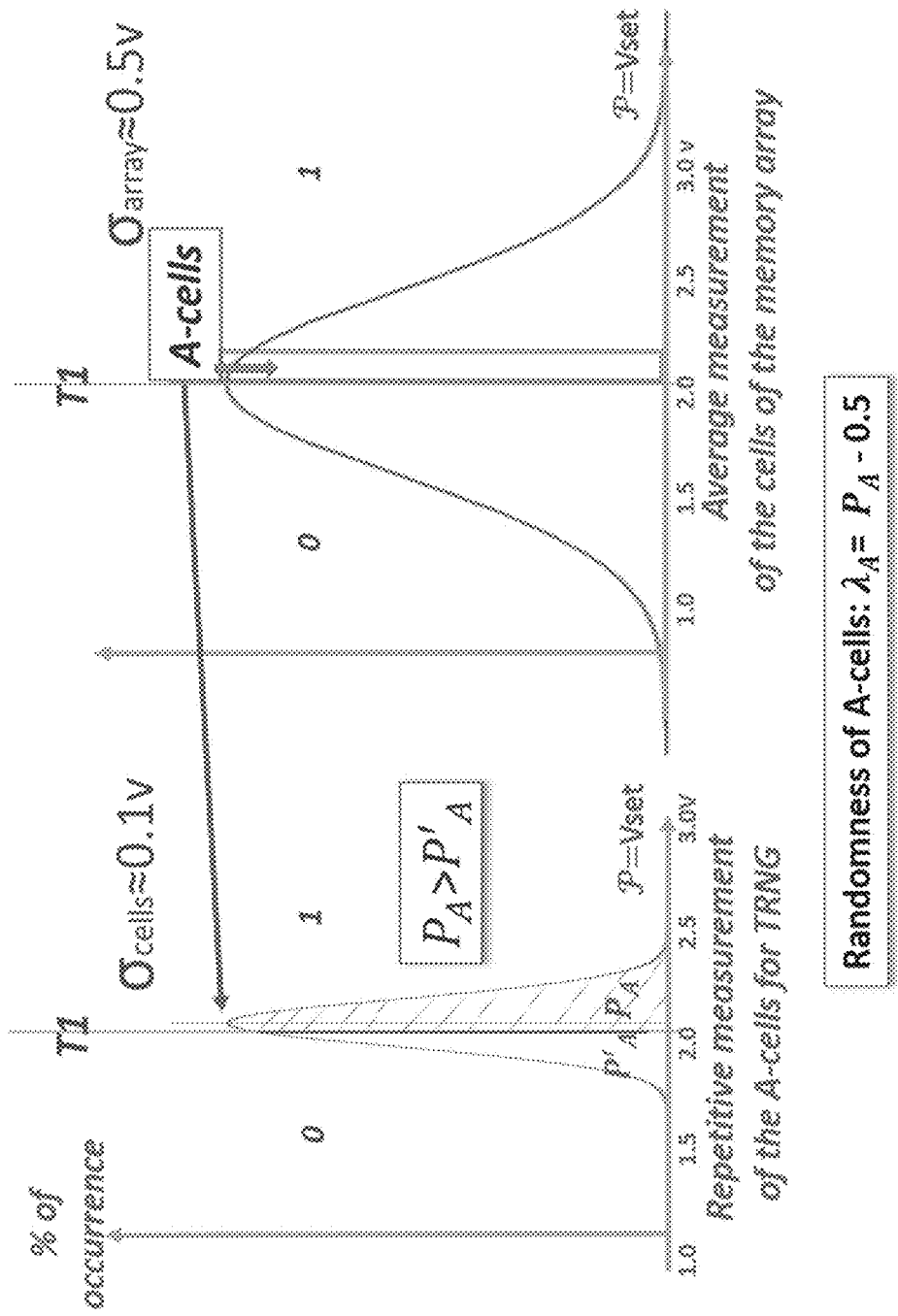
FIG. 4 is a schematic illustrating randomness of A-cells in an implementation of the generation of X-cells.
Figure 5:
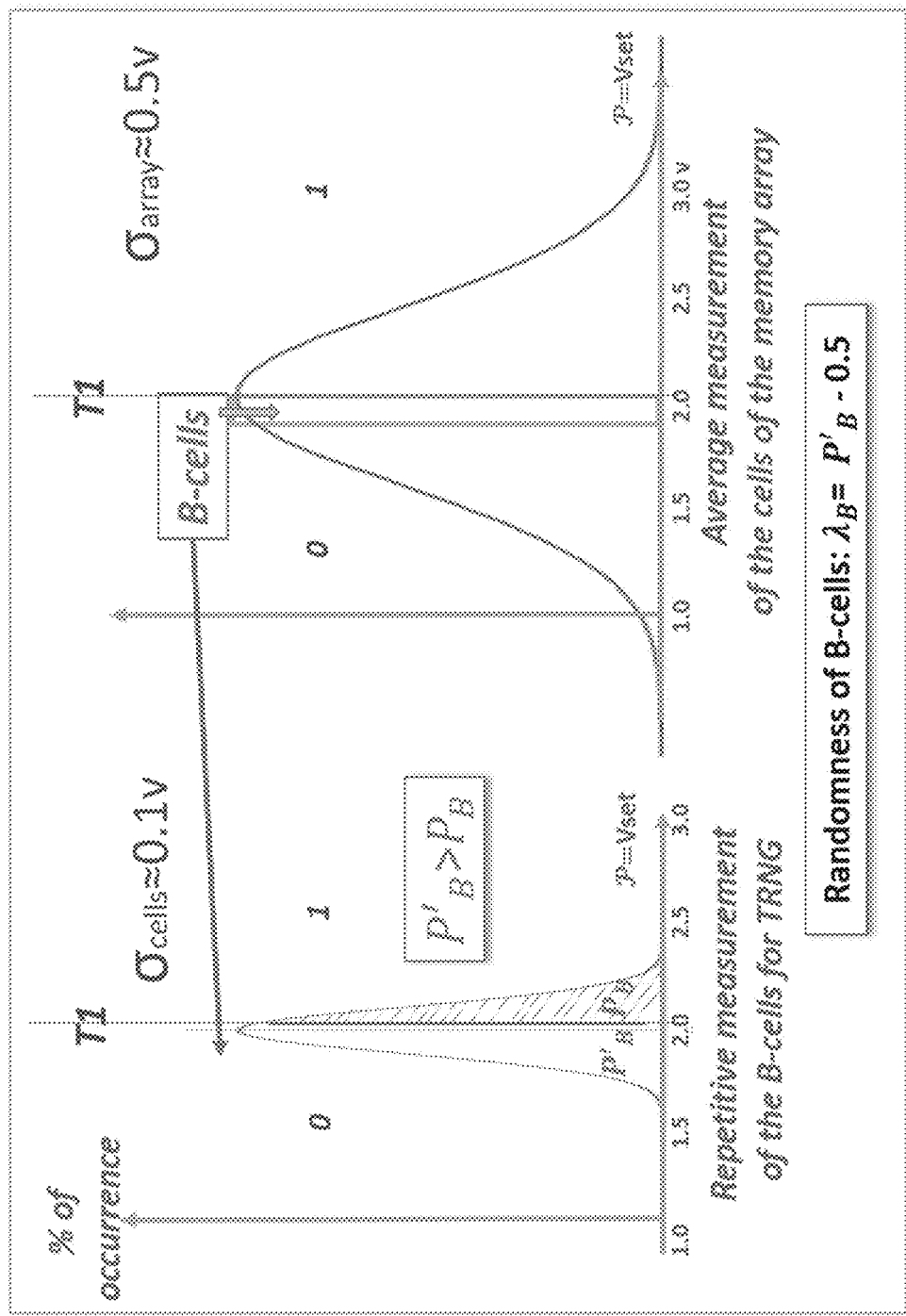
FIG. 5 is a schematic illustrating randomness of B-cells in an implementation of the generation of X-cells.
Figure 6:
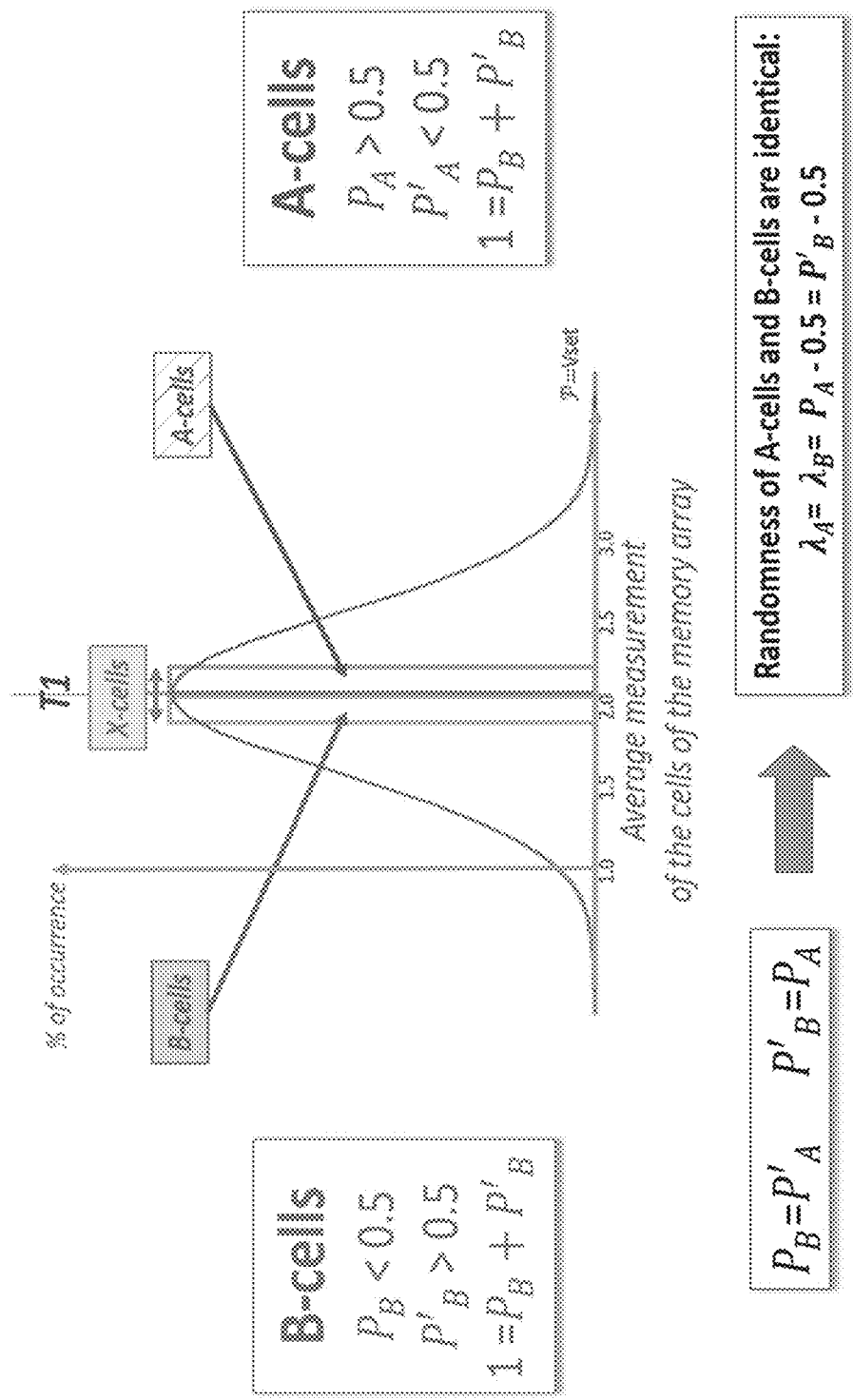
FIG. 6 is a schematic illustrating that the randomness of A-cells and B-cells is identical in an implementation of the generation of X-cells.

This disclosure, its aspects and implementations, are not limited to the specific components, assembly procedures or method elements disclosed herein. Many additional components, assembly procedures and/or method elements known in the art consistent with the intended data compiler will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such data compilers, and implementing components and methods, consistent with the intended operation and methods.

This application is related to and incorporates by reference the prior filed U.S. Utility patent application Ser. No. 15/150,179, titled "Random Number Generating Systems and Related Methods," listing as first inventor Bertrand Cambou, filed May 9, 2016, now pending (hereinafter "the '179 application"), which is a continuation-in-part of prior filed U.S. Utility patent application Ser. No. 14/958,436, titled "Physically Unclonable Function Generating Systems and Related Methods," listing as first inventor Bertrand Cambou, filed Dec. 3, 2015, now pending (hereinafter "the '436 application"), which '436 application claims the benefit of the filing date of U.S. Provisional Pat. App. Ser. No. 62/204,912, titled "Physically Unclonable Function Generating Systems and Related Methods," listing as first inventor Bertrand Cambou, filed Aug. 13, 2015, now expired (hereinafter "the '912 application") (the '179 application, the '436 application, and the '912 application hereinafter jointly referred to as "the Prior Applications"), the disclosures of each of which are hereby incorporated entirely herein by reference.

The Prior Applications discuss, among other things, random number generating systems and related methods, including various ways to extract true random number generators (TRNG) from memory products using/having ternary states. In the Prior Applications, the use, identification, and creation of ternary states ("Xs") was described, which allows the selection of cells that are unstable, and can easily switch back and forward between a "1" and a "0". The Prior Applications describe how the level of randomness of ternary cells can be used as a foundation for TRNG when coupled with other methods of randomization.

Discussed herein are two complementary elements:
1. how an data compiler using XOR processing the data available from multiple ternary cells can create an very high level of randomness, and;
2. how a combinational probability model allows the quantification of the level of randomness of the TRNG/ data compiler. Deviations from absolute randomness of these TRNG/data compilers in terms of probability to be non-random can be lower than $10^{-10}$ which is accepted as non-detectable from existing and computing systems used in the foreseeable future.

Section 1

1-1 Memory with Ternary States—TRNG vs. RGNs

In the Prior Applications, some methods used to create RNGs with memories were discussed, in particular when generated with SRAM, DRAMs, Flash RAMs, Resistive RAMS, and STT MRAM. Various methods are also discussed in the following publications: U.S. Pat. App. Pub. No. 2012/0265928A1, entitled "Non-Volatile Memory Devices, Methods of Operating Non-Volatile Memory Devices, And Systems Including The Same," to Kui-Yon Mun et al., published Oct. 18, 2012; Daniel E. Holcomb, Wayne P. Burleson, and Kevin Fu, "Power-Up SRAM State as an Identifying Fingerprint and Source of True Random Numbers," IEEE Transactions on Computers, Vol. 58, Issue 9, September 2009, pages 1198-1210; U.S. Pat. No. 4,161, 041, entitled "Pseudo random number generator apparatus," to Eric W. Butler et al., issued Jul. 10, 1979; U.S. Pat. No. 7,979,482, titled "Random number generator configured to combine states of memory cells," to Berndt Gammel et al., issued Jul. 12, 2011; and Ioana Vatajelu, Giorgio Di Natale, Mario Barbareschi, Lionel Torres, Marco Indaco, and Paolo Prinetto, "STT-MRAM-Based PUF Architecture exploiting Magnetic Tunnel Junction Fabrication-Induced Variability," ACM Journal on Emerging Technologies in Computing Systems, Vol. 13, Issue 1, June 2016, Article No. 5, the disclosures of each of which are hereby incorporated entirely herein by reference. The natural physical parameter variations due to small manufacturing variations are exploited herein for random number generators RNGs, using methods similar to the ones applied to extract PUF (Physically Unclonable Function) Challenge and Responses Pairs.

Designing RNGs and PUFs have opposite objectives, however, as the expectation of the RNG is that the numbers generated at each request should be totally different from prior requests, while the responses of a PUF should be predictable, and as close as possible to the reference pattern, the PUF challenge. The segmentation of the cells of a memory array between the predictable cells which yield a reproducible "0" or "1", and the ternary "X" cells that are unstable, allows the design of solid PUFs (see the Prior Applications).

In order to exploit the data streams thereby generated as true RNG (i.e. TRNG), the Prior Applications describe how additional operations of randomization are used. One of the complicated details of RNG, or TRNG, is quantifying the figure merit of randomness of the RNG. Each bit X of a data stream of N bit of a perfect RNG should have precisely the probability $P_{(X=1)}=0.5$ to be either a "1" or a "0". The average deviation from perfection $\lambda$ is given by $P_{(X=1)}=0.5+\lambda$. Assuming that the length of the RNG data stream is N=128, the number of possible combinations is $2^{128}=3.4 \cdot 10^{38}$, which is too large for existing or foreseeable computing systems to handle.

If $\lambda$ is too low, and if the crypto-analyst has access to a large number of random numbers, the RNG will be compromised by observing a deviation from perfect randomness. In 1999, it was suggested that $\lambda$ greater than $10^{-3}$ would not be acceptable, because the resulting RNG are exposed to sophisticated hackers. See Juan Soto, "Statistical Testing of Random Number Generators," National Institute of Standards & Technology, published online at least as early as Jun. 27, 2012, a copy of which is hereby submitted herewith as Appendix A, the disclosure of which is hereby incorporated entirely herein by reference. The value of $\lambda$ that is considered as acceptable to get a safe TRNG is a moving target as the computing elements become increasingly powerful. To the best of current knowledge $\lambda<10^{-5}$ is currently considered as an excellent target, while $\lambda>10^{-10}$ is considered as overly safe.

1-2 XOR Processing for Randomization and Cryptography

EXclusive OR, XOR, is a Boolean logic gate utilized in cryptography. Two input bits X, and Y are transformed into $Z=X \oplus Y$, with the following truth table: Z=0 if X=Y (0 or 1), Z=1 if X≠Y. XOR logic is part of the Data Encryption System (DES), and the Advanced Encryption System (AES) to add confusion and randomization in the encryption and decryption process.

XOR scramblers are used to enhance randomization in multicarrier communications as described in U.S. Pat. No. 9,191,039, entitled "Randomization using an XOR scrambler in multicarrier communications," to Marcos C. Tzannes et al., issued Nov. 17, 2015, the disclosure of which is hereby incorporated entirely herein by reference. XOR processors are used to generate scrambling sequences to achieve data randomization in a memory circuit, as well as enhancing random number generators, see U.S. Pat. Pub. No. 2015/0378890A1, entitled "Multi-Dimen[s]ional Data Randomization", to Nicholas Odin Lien et al., published Dec. 31, 2015; U.S. Pat. No. 8,990,481, entitled "Method of operating nonvolatile memory devices storing randomized data generated by copyback operation," to Sang-Yong Yoon et al, issued Mar. 24, 2015; U.S. Pat. No. 6,240,432, entitled "Enhanced random number generator," to Wei-Tong Chuang et al, issued May 29, 2001; U.S. Pat. No. 7,146,006, titled "Method for improving a random number generator to make it more resistant against attacks by current measuring," to Jean-Sebastien Coron et al, issued Dec. 5, 2006; and George Marsaglia, "XORShift RNGs," Journal of Statistical Software Vol. 8 (2003), Jul. 4, 2003, a copy of which is filed herewith as Appendix B, the disclosures of each of which are hereby incorporated entirely herein by reference.

Two reasons for the use of a XOR are: first, the knowledge of Z is not disclosing the value of X and Y (Z=0 can be the result of the pair 00, or the pair 11; Z=1 can be the result of the pair 01, or the pair 10); second, this is a symmetrical function when applied twice ($X \oplus Y \oplus Y = X$). This second attribute allows XOR to encrypt (initial XOR) and decrypt (second XOR) in multiple encryption algorithms. The first of these two attributes is used to improve randomization, and this method is used in this disclosure: if two bits X and Y are somewhat random, the bit Z, with $Z=X \oplus Y$, is even more random than either X or Y.

A quantification of the effect of XOR in enhancing the randomization of RNG created with a memory, and ternary states, is also presented below in section 3.

Section 2—Method to Enhance Ternary Based RNG with XOR 2-1 Description of the Method 2-1-1 Sorting Out the Ternary States "X"

The selection of the cells that are somewhat unstable, and sorted with the ternary state "X", can randomly switch between a "0" and a "1". It is assumed that within the cells of the memory array the distribution of the physical parameter $\mathcal{P}$ that is used to determine if a cell is a "0" or a "1" is following a normal distribution, with a standard variation $\sigma$ due to cell to cell variations created during manufacturing, and other instabilities. It is also assumed that every time a new measurement of $\mathcal{P}$ is done on the same cell, this measurement will also follow a normal distribution with a standard variation $\sigma_{intr}$ responding to various measurement instabilities, noise, and environmental variations. In implementations $\sigma_{intr}$ will be much lower than $\sigma$ for quality commercial memories to be sure that "0" and "1" are clearly defined.

The segmentation of the cells between the ones that are blanked with the ternary state and the more stable ones can be very selective, and only the cells close to the transition of parameter $\mathcal{P}$ between "0" and "1" can be selected. To maximize the chance of a random flip between "0s" and "1s" this distance should then be lower than $\sigma_{intr}$. In such a case the level of randomness can be high, however, only a small percentage of the cells are blanked as "X". For 128 bits RNG, as much as 10,000 bits of the array may be required for high randomness.

On the other hand, if more cells are blanked with the ternary state "X" further away from the transition T1 of parameter $\mathcal{P}$ between the states "0" and "1", the level of randomness is lower. In Section 3, a methodology to optimize this segmentation is presented.

2-1-2 Description of the Cells with Ternary States

As shown in FIGS. 1, 2, 3, 4, 5, and 6, the cells that are sorted as unstable with an "X" state can be segmented into two subgroups:

1. The cells that have a higher probability to be tested as a "1" are called A-cells. They have an average probability $P_A$ to be tested as "1" $P_A=0.5+\lambda_A$, and an average probability $P'_A$ to be a "0" $P'_A=0.5-\lambda_A$;
2. The cells that have a higher probability to be tested as a "0" are called B-cells. They have an average probability $P'B$ to be tested as a "0" $P'_B=0.5+\lambda_B$, and an average probability $P_B$ to be a "1" $P_B=0.5-\lambda_B$. The selection of the transition of parameter $\mathcal{P}$ between "0s" and "1s" can be such that the number of A-cells equals the number of B-cells and that $P_A=P'_B$, or $\lambda_A=\lambda_B$.

As it is presented in Section 3 (which is based on experimental data), with only 4% of the cell population selected as "X", $P_A$ and $P'_B$ are still relatively high with $\lambda_A=\lambda_B$ in the $4\times10^{-2}$ range, far away from the level of randomness necessary to generate quality TRNG. As already presented Section 1, and in the Prior Applications, additional enhancement of the level of randomness is desirable for TRNG.

2-1-3 Use of a Data Compiler Using an XOR Processor and Ternary States

Figure 7:
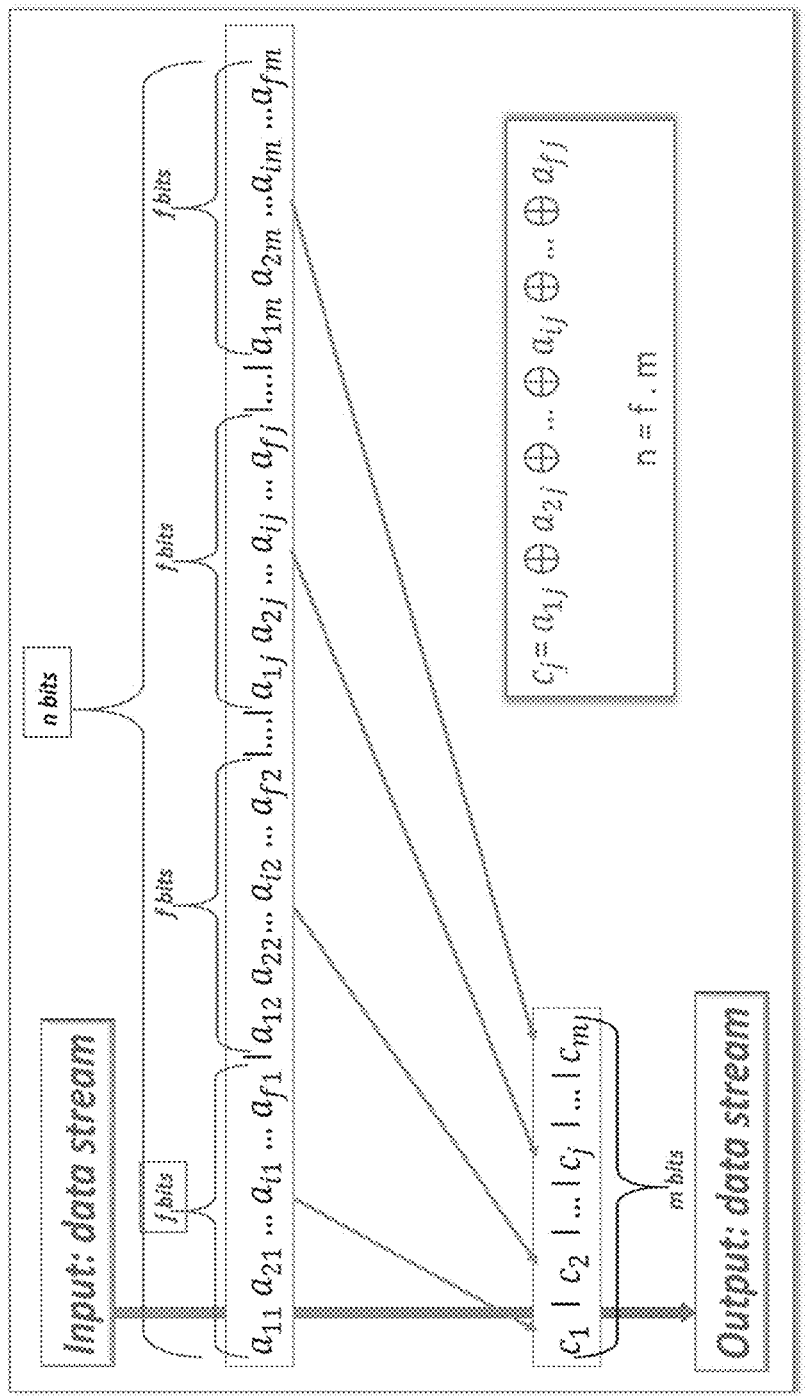
FIG. 7 is a schematic illustrating an implementation of an exclusive OR (XOR) data processor.

Assume that the stream of random numbers generated by a memory array with ternary states is $\{a_1, a_2, \ldots, a_i, \ldots a_n\}$. This stream is grouped in chunks of f bits $\{a_{j1}, a_{j2}, \ldots, a_{ij}, \ldots, a_{jf}\}$ with f<n. For example, 1,280 random bits grouped in 128 chunks of 10 bits. The randomization is achieved with an XOR processor by creating a stream of true random numbers $\{c_1, c_2, \ldots, c_j, \ldots, c_m\}$ defined as shown in FIG. 7, where $c_j=a_{j1} \oplus a_{j2} \oplus \ldots \oplus a_{ij} \oplus \ldots \oplus a_{jf}$ and n=m.f.

Figure 11:
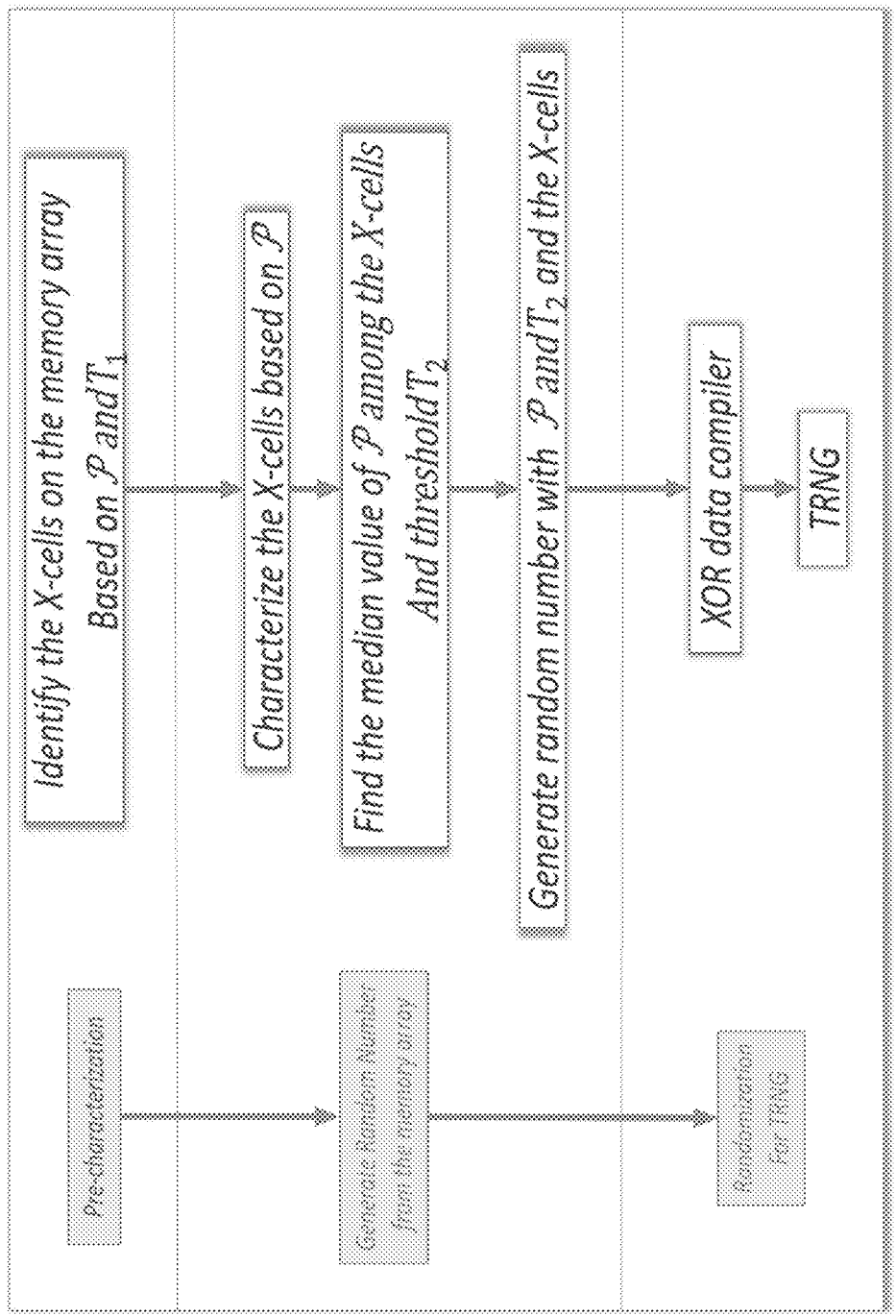
FIG. 11 is a flow chart for an implementation of a method for generating a true random number.
Figure 12:
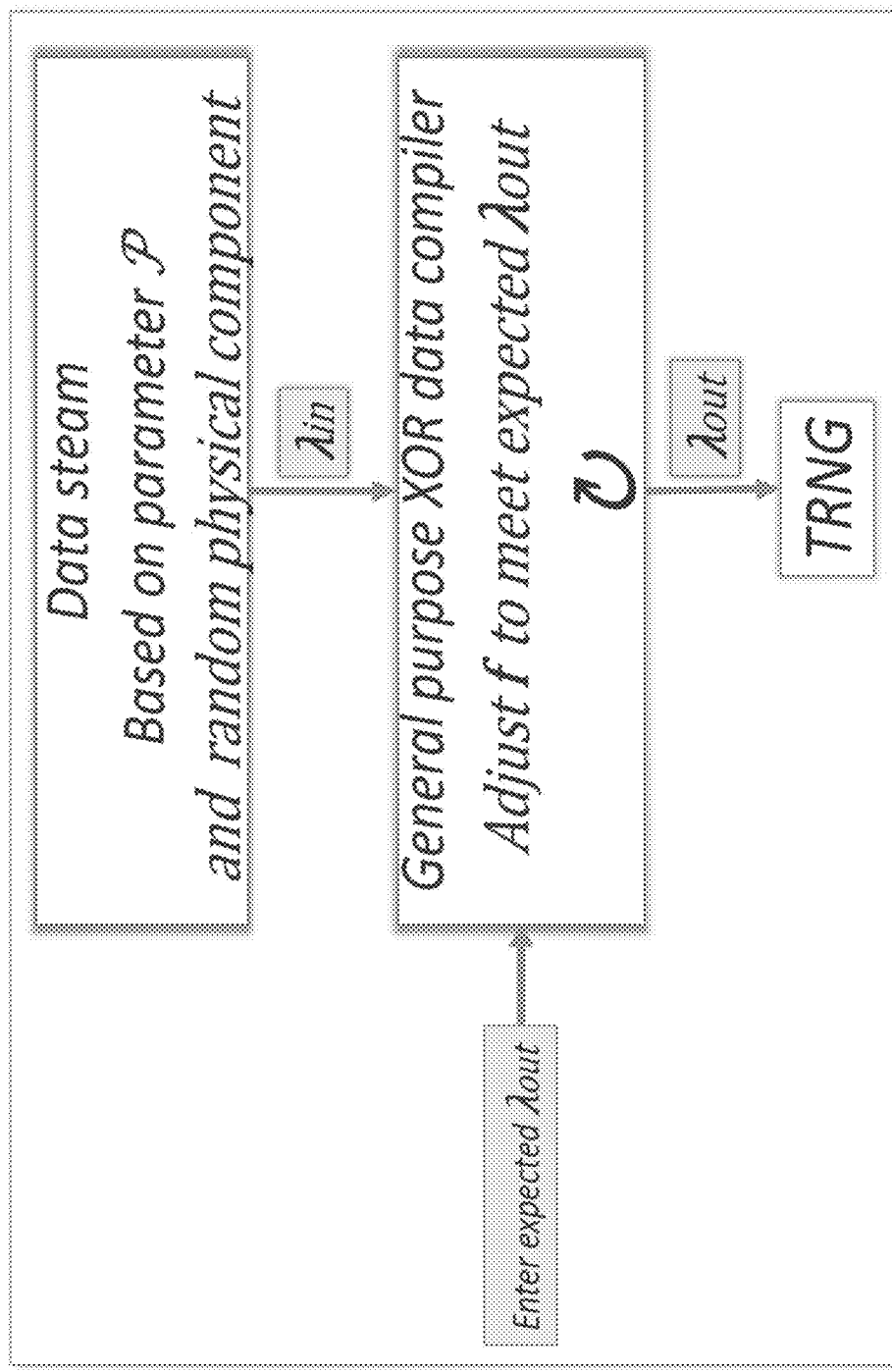
FIG. 12 is a flow chart for an implementation of a general purpose data compiler/true random number generator.

As proven below, such a randomization when applied to a stream of random numbers, generated by a physical device/memory array with ternary states, is extremely effective to generate truly random numbers, and be a TRNG. It is also proven below in the experimental section that such a method when applied to a stream of numbers extracted from a physical device/memory array without sorting out the ternary states is not effective. It is demonstrated in Section 3 that the combination of the method using ternary states, as described in the Prior Application, with this straightforward data compiler using XOR processing, can generate TRNG with $\lambda<10^{-10}$. XOR logic can be implemented at the software level, or in hardware, as only a few logic gates are necessary. These gates can be inserted as part of the circuitry controlling the memory to directly feed the secure processor, and crypto-processor with quality TRNG. This circuitry, also called the state machine of the memory, typically drives machine operations such as the write, read, and erase of the memory itself. By non-limiting example, the XOR data processor may also be implemented by one of a general purpose processor and an application specific integrated circuit (ASIC). The description of the new method of generating a true random number (TRNG) is shown in FIG. 11 and FIG. 12.

Section 3—Proof of Randomness

One element of this disclosure is the development of a model that quantifies the level of randomness of the method using combinational probability and statistics. This model has been developed with the same experimental data that is disclosed in the Prior Applications, which was based on the specific physical device of a metal oxide resistive Random Access Memories (ReRAM).

3-1 Experimental Data

The parameter $\mathcal{P}$ that is analyzed is the Vset of the array of metal oxide resistive RAM. The transition between the "0" state and the "1" state of the distribution is 2.1 Volts, and this distribution is considered a normal distribution. As illustrated in FIG. 8, five cases were measured:

1. Case-1: Only 2% of the cells are the ternary states "X" which are used to generate random number. For these cells parameter $\mathcal{P}$ is very close to the transition of 2.1 Volts. Half of the cells, the A-cells, have $P_A=0.52$ probabilities to be a "1", $P'_A=0.48$ probabilities to be a "0", with $\lambda_A=2\times10^{-2}$. The second group, the B-cells, have $P_B=0.48$ probabilities to be a "1", $P'_B=0.52$ probabilities to be a "0", with $\lambda_B=\lambda_A=2\times10^{-2}$.

2. Case-2: 4% of the cells are ternary states. The probabilities as defined above are: $P_A=P'_B=0.54$; $P'_A=P_B=0.46$; $\lambda_B=\lambda_A=4\times10^{-2}$.

3. Case-3: 7% of the cells are ternary states. The probabilities as defined above are: $P_A=P'_B=0.56$; $P'_A=P_B=0.44$; $\lambda_B=\lambda_A=6\times10^{-2}$.

4. Case-4: 11% of the cells are ternary states. The probabilities as defined above are: $P_A=P'_B=0.60$; $P'_A=P_B=0.40$; $\lambda_B=\lambda_A=1\times10^{31\ 1}$.

5. Case-5: 100% of the cells are included. The probabilities as defined above are: $P_A=P'_B=0.90$; $P'_A=P_B=0.10$; $\lambda_B=\lambda_A=4\times10^{-1}$. In this case, there are no ternary states, the entire memory array is used to generate random numbers.

The reason we are considering this range of options is to quantify the effectiveness of the XOR scrambling to generate a random number as a function of how tight the ternary state distribution is. Case-1 is the one with the higher initial randomness, while Case-5 is the lowest one.

3-2 Probabilistic Model

One objective is to model the probabilities $P_C$ for $c_j$, the result of several XORs $c_j=a_{j1} \oplus a_{j2} \oplus \ldots \oplus a_{ij} \oplus \ldots \oplus a_{jf}$, to be a "1", and the variation $\lambda$ from randomness. Each of the random bits that are from the chunk of bits $\{a_{j1}, a_{j2}, \ldots, a_{ij}, \ldots, a_{jf}\}$ are either generated from A-cells or B-cells. Any of these chunks that are f long will have s A-cells and t B-cells with s+t=f Considering that the probability to have an A-cell and a B-cell is equal to 0.5, the probability to have such a (s, t) configuration is: $C_{f,s}/f!$ with $C_{f,s}=f!/s!(f-s)!$.

3-2-1 Case where all Cells Generating $\{a_{j1}, a_{j2}, \ldots, a_{ij}, \ldots, a_{jf}\}$ are A-Cells In this case t=0, and s=f. Considering the binomial distribution with $P_A$ the probability of $a_{ij}$ to be a "1", and $P'_A$ the probability for $a_{ij}$ to be a "0", the Bernoulli formula is giving the following polynomial:

$$1 = \sum_{i=0}^{i=f} C_{f,i} P_A^i P'^{f-i}_A = \sum_{i=0}^{i=f} [i \bmod 2] C_{f,i} \quad P_c$$

$$P_A^i P'^{f-i}_A + \sum_{i=0}^{i=f} [(i+1) \bmod 2] C_{f,i} P_A^i P'^{f-i}_A \quad P'_c$$

The term $P_A^i P'^{f-i}_A$ corresponds to a configuration where i bits are "1s", and f-i bits are "0". When i is odd, i mod2=1, the resulting XOR $c_j$ is "1", when i is even, (i+1) mod2=1, $c_j$ is "0". The notation mod2 is the known mathematical concept modulo. The probability $P_C$ (for $c_j$ to be a "1") includes all the terms $C_{f,i} P_A^i P'^{f-i}_A$ with i odd, and the probability $P'_C$ (for $c_j$ to be a "0") includes the same terms with i even. This can be written as:

i) If f is even, f=2k: $P_C=\Sigma_{i=0}^{i=k-1} C_{2k,2i+1} P_A^{2i+1} P'^{2k-2i-1}_A$     eq 1

$P'_C=\Sigma_{i=0}^{i=k} C_{2k,2i} P_A^{2i} P'^{2k-2i}_A$     eq 2

In this case $P_C<P'_C$ and can be written as $P_C=0.5-\lambda c_j$ with $\lambda c_j$ the deviation from pure randomness which is $P_C=0.5$. It can also be written as $P'_C=0.5+\lambda c_j$.

ii) If f is odd, f=2k+1: $P_C=\Sigma_{i=0}^{i=k} C_{2k+1,2i+1} P_A^{2i+1} P'^{2k-2i}_A$     eq 3

$P'_C=\Sigma_{i=0}^{i=k} C_{2k+1,2i} P_A^{2i} P'^{2k+1-2i}_A$     eq 4

In this case $P_C>P'_C$ and can be written as $P_C=0.5+\lambda c_j$ with $\lambda c_j$ the deviation from pure randomness. It can also be written as $P'_C=0.5-\lambda c_j$.

3-2-2 $\{a_{j1}, a_{j2}, \ldots, a_{ij}, \ldots, a_{jf}\}$ Generated by Combination of A-Cells & B-Cells The symmetry between the A-cells and the B-cells ($P_A = P'_B$ and $P'_A = P_B$) results in the following property:

1. If the chunk of bits $\{a_{j1}, a_{j2}, \ldots, a_{ij}, \ldots, a_{jf}\}$ is generated by an even number of B-cells, the probabilities $P_{CB}$ and $P'_{CB}$ are the same than if the chunk was only generated by A-cells as described in 3-2-2: If f is even, following eq1 & eq2 $P_{CB} = P_C$ and $P'_{CB} = P'_C$; if f is odd, following eq3 and eq4 $P_{CB} = P_C$ and $P'_{CB} = P'_C$.
2. If the chunk of bits $\{a_{j1}, a_{j2}, \ldots, a_{ij}, \ldots, a_{jf}\}$ is generated by an odd number of B-cells, the probabilities that $P_{CB}$ and $P'_{CB}$ are the opposite, than if the chunk was only generated by A-cells as described in 3-2-2: If f is even, following eq1 & eq2, and reversing the order $P_{CB} = P'_C$ and $P'_{CB} = P_C$; if f is odd, following eq3 & eq4, and reversing the order $P_{CB} = P'_C$ and $P'_{CB} = P_C$.

In all cases $|\lambda c_j|$ is the statistical deviation from pure randomness, regardless of $P_C$ being greater or lower than $P'_C$. This deviation $|\lambda c_j|$ is smaller than $\lambda_A$, the level of randomness was increased by the data compiler using an XOR data processor.

3-2-2 Checking the Model—Coupling Two Cells

Figure 13:
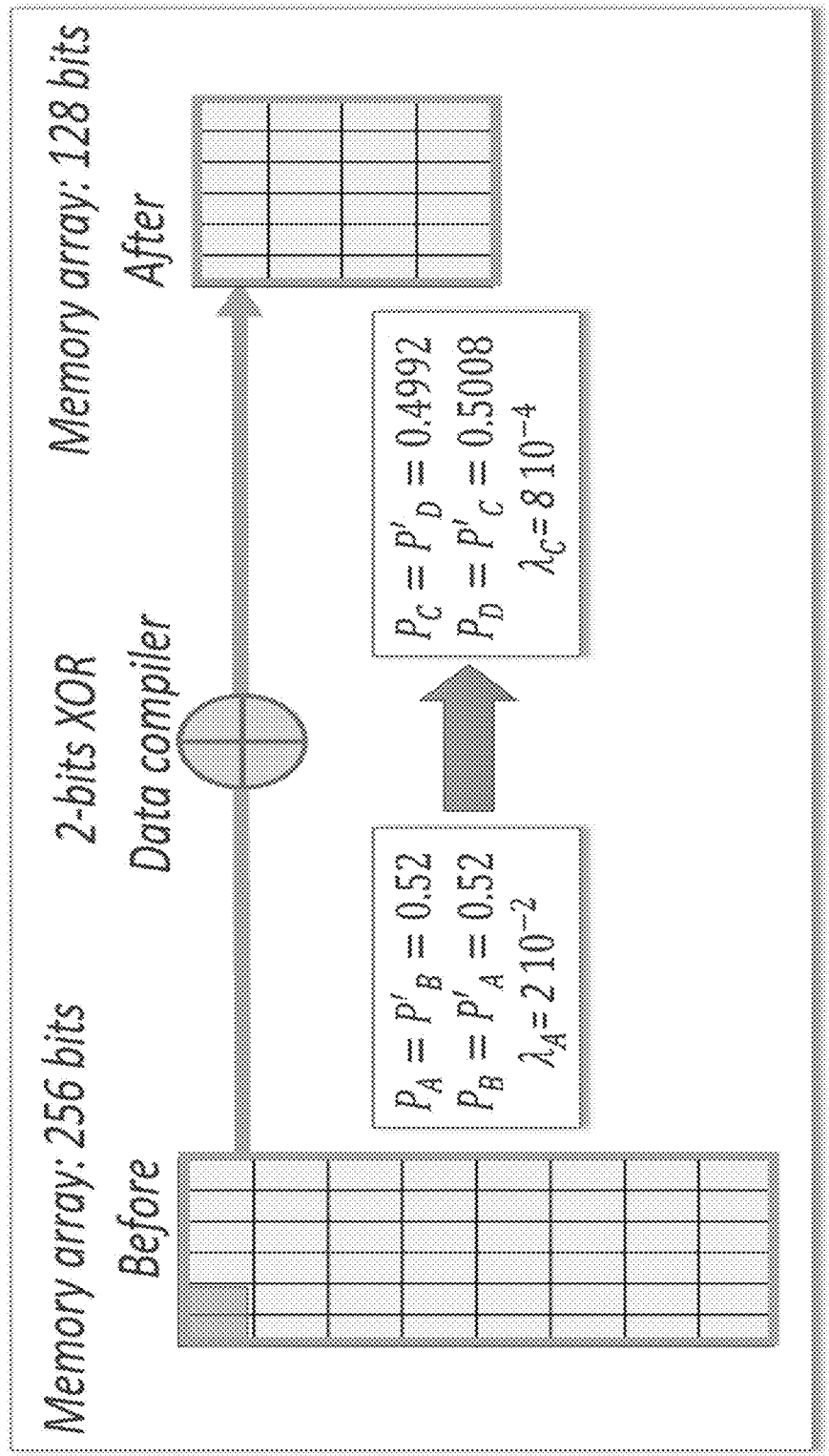
FIG. 13 is a schematic illustrating an implementation of a data compiler using 2-bits.

One simple way to implement the method is to XOR the data stream two adjacent bits by two adjacent bits for the entire stream, f=2. This is representatively illustrated in FIG. 13. There are three configurations, both cells are A-cell, one cell is an A-cell and the second is a B-cell, and both cells are B-cells. Assume that $P_A = P'_B = 0.52$; $P'_A = P_B = 0.48$; $\lambda_B = \lambda_A = 2 \cdot 10^{-2}$.

Number of A-cells is even: two A-cells, or two B-cells.
1. The probability $P'_C$ to have $c_j = a_{j1} \oplus a_{j2}$ been a "0" is:
$P'_C = P'^2_A + P^2_A = 0.5008 \rightarrow \lambda_C = 8 \times 10^{-4}$ (two cases to get $c_j$ at "0": $\{00\}$ or $\{11\}$)
2. The probability $P_C$ to have $c_j = a_{j1} \oplus a_{j2}$ been a "1" is:
$P_C = 2(P_A P'_A) = 0.4992$ (two cases to get $c_j$ at "1": $\{01\}$ or $\{10\}$)

Number of A-cells is odd: one A-cell, and one B-cell.
1. The probability $P_C$ to have $c_j = a_{j1} \oplus a_{j2}$ been a "1" is:
$P'_C = P^2_A + P'^2_A = 0.5008 \rightarrow \lambda_C = 8 \times 10^{-4}$ (two cases to get $c_j$ at "1": $\{10\}$ or $\{01\}$)
2. The probability $P'_C$ to have $c_j = a_{j1} \oplus a_{j2}$ been a "0" is:
$P_C = 2(P_A P'_A) = 0.4992$ (two cases to get $c_j$ at "1": $\{00\}$ or $\{11\}$)

In this case, f=2 is even. Eq1 and eq2 are applicable when the number of A-cells is even ($P_C < P'_C$), and are reversed when the number of A-cells is one ($P_C > P'_C$). The level of randomness $\lambda_C = 8 \times 10^{-4}$ is 25 times smaller than the level of randomness before the XOR processor, $\lambda_A = 2 \times 10^{-2}$.

3-2-3 Checking the Model—Coupling Three Cells

Figure 14:
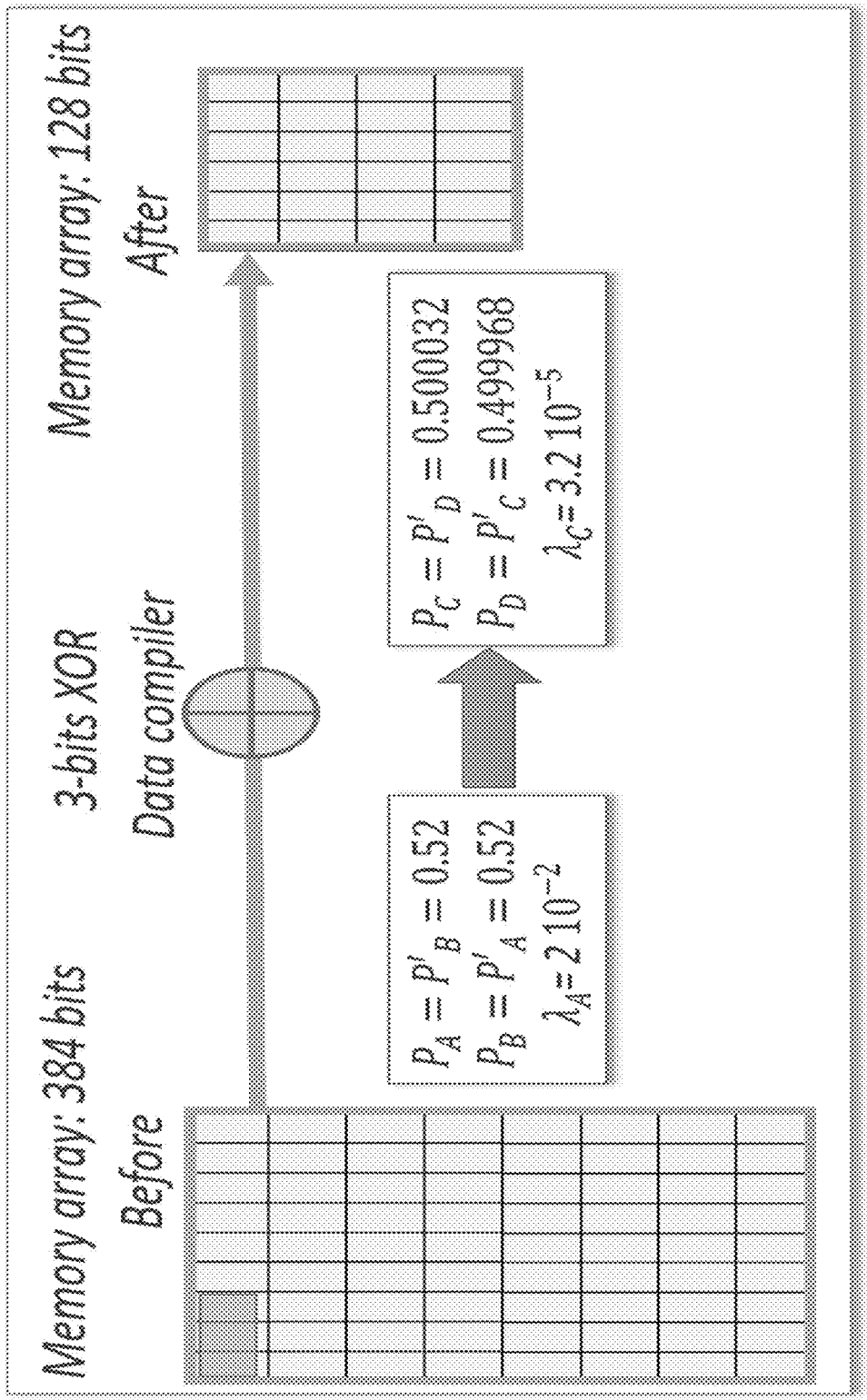
FIG. 14 is a schematic illustrating an implementation of a data compiler using 3-bits.

In this case the data steam XOR three adjacent bits by three adjacent bits for the entire stream, f=3. This is representatively illustrated in FIG. 14. There are four configurations, all cells are A-cells, two cells are A-cells & one cell is B-cell, one cell is A-cell & two cells are B-cells, and all cells are B-cells. Assume again that $P_A = P'_B = 0.52$; $P'_A = P_B = 0.48$; $\lambda_B = \lambda_A = 2 \times 10^{-2}$.

i) Number of A-cells is odd: Three A-cells, one A-cell & two B-cells.
The probability $P_C$ to have $c_j = a_{j1} \oplus a_{j2} \oplus a_{j3}$ been a "1" is:

$P_C = P^3_A + 3 P_A P'^2_A = 0.500032 \rightarrow \lambda_A 3.2 \times 10^{-5}$ (four cases to get $c_j$ at "1": $\{111\}$, $\{100\}$, $\{010\}$, or $\{001\}$)

The probability $P'_C$ to have $c_j = a_{j1} \oplus a_{j2} \oplus a_{j3}$ been a "0" is:

$P'_C = P'^3_A + 3 P'_A P^2_A = 0.499968$ (four cases to get $c_j$ at "0": $\{011\}$, $\{101\}$, $\{110\}$, or $\{000\}$)

ii) Number of A-cells is even: Three B-cells, one B-cell & two A-cells.
The probability $P'_C$ to have $c_j = a_{j1} \oplus a_{j2} \oplus a_{j3}$ been a "0" is:

$P'_C = P^3_A + 3 P_A P'^2_A = 0.500032 \rightarrow \lambda_A = 3.2 \times 10^{-5}$ (four cases to get $c_j$ at "1": $\{000\}$, $\{110\}$, $\{011\}$, or $\{101\}$)

The probability $P_C$ to have $c_j = a_{j1} \oplus a_{j2} \oplus a_{j3}$ been a "1" is:

$P'_C = P'^3_A + 3 P'_A P^2_A = 0.499968$ (four cases to get $c_j$ at "0": $\{111\}$, $\{100\}$, $\{010\}$, or $\{001\}$)

In this case, f=3 is odd. Eq3 and eq4 are applicable when the number of A-cell is odd ($P_C < P'_C$), and are reversed when the number of A-cell is even. The resulting level of randomness, $\lambda_C = 3.2 \times 10^{-5}$, is $25 \times 25 = 625$ times smaller than the level of randomness before the XOR processor, $\lambda_A = 2 \times 10^{-2}$.

3-3 Analysis of the Experimental Data

Figure 9:
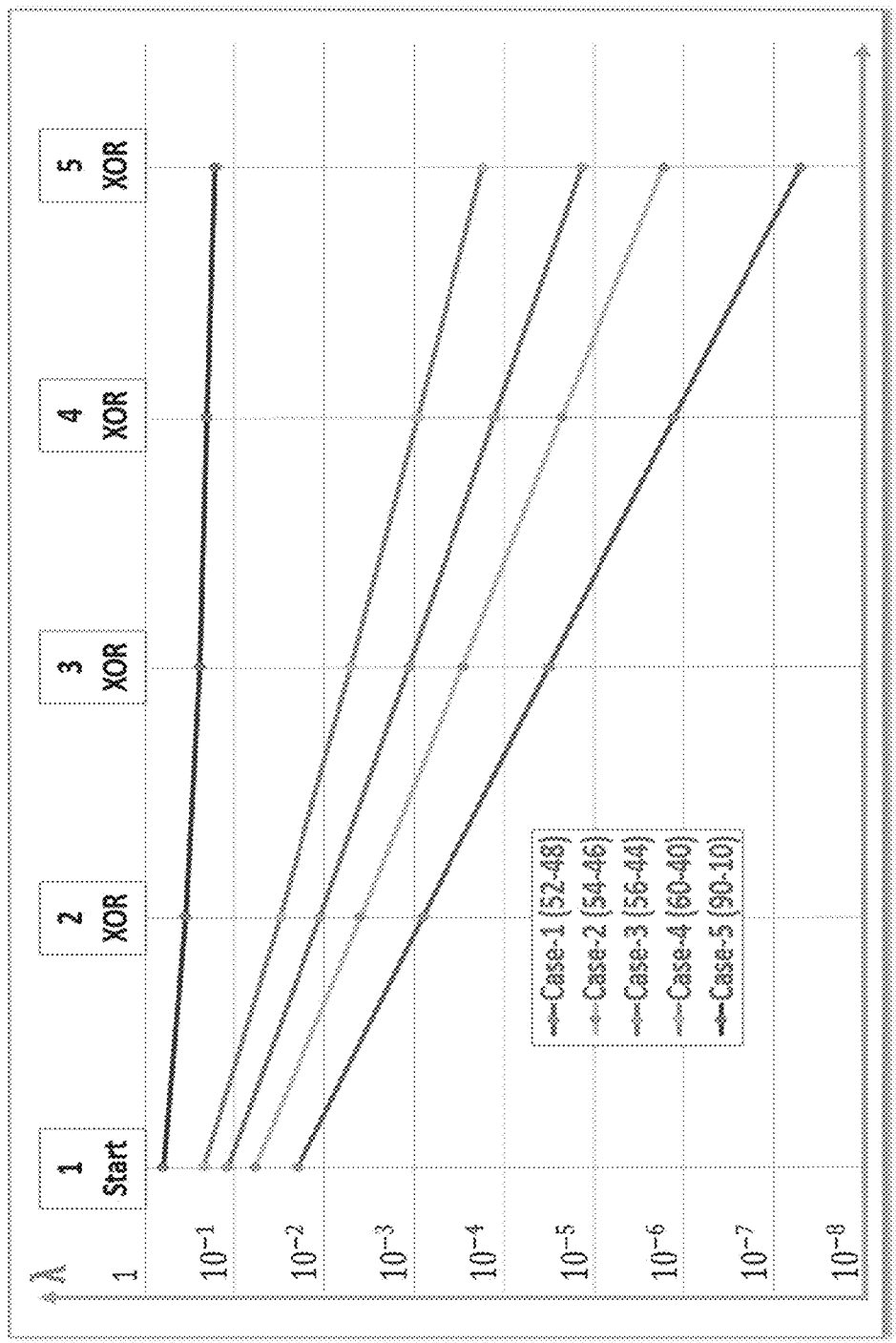
FIG. 9 is a graph illustrating the level of randomness, $\lambda$, after applying an implementation of a data compiler using an XOR data processor.

The probabilistic model of Section 3-2 is used to analyze the five experimental cases presented in Section 3-1. In FIGS. 8 and 9 the impact of the data processor using an XOR data processor is presented when f varies from 2 to 5. One observation is the lack of efficiency of the XOR processor on Case-5, the one without ternary states. The lack of initial randomness of this case is such that the method presented in this disclosure is weak. In all other cases, the data compiler using an XOR processor when combined with the "X" ternary states are very efficient. Case-1 which has the highest level of initial randomness, has the data compiler using an XOR processor with the highest efficiency: with 5 XOR, $\lambda_A = 5.12 \times 10^{-8}$ which is a very small deviation from absolute randomness. Using the model as a predictive tool is straightforward. For example, as shown FIG. 10 it is possible to calculate the number f necessary to get $\lambda_A < 10^{-10}$ for cases 1 to 4. This confirms the efficiency of the data compiler using an XOR data processor when combined with a higher initial randomness, e.g., case-1.

Section 4—Hacker Protection and Generalization of the Concept 4-1 Effect of Parameter Drifts The initial source of randomness of this TRNG is a physical device. This is a fundamental strength compared with mathematically generated pseudo RNG (PRNG) because mathematical algorithms can be discovered by the hacker, while unclonable physical elements are random due to micro-variations during manufacturing, and natural noise effect during measurements. However physical elements can vary in a predictable way when subject to effects such as temperature change, biasing conditions, and induced attacks. For example, the value of the Vset of a resistive RAM goes down when subject to higher temperature. A hacker could submit the physical element to a hot air blower to increase temperature, reduce Vset, thereby making both A-cells and B-cells appear similar, with a high probability to be tested as "0". This could result in much lower randomness with most cells at "0".

The remedy of such possible side channel attacks is to incorporate a randomization of the distribution of A-cells and B-cells with the following method for generating a true random number (representatively illustrated in FIG. 11):

Step-1: Sorting of the instable cells, the X-cells with high level of randomness (sorting based on the value of parameter $\mathcal{P}$, and a threshold $T_1$ differentiating the zeros from the ones), keeping track of the mapping of the "x" cells.

Step-2: Prior to RNG, all X-cells are retested with parameter $\mathcal{P}$.

Step-3: Identification of the threshold $T_2$ placed at the median of the population. By design half of the X-cells are below $T_2$, and half are above $T_2$.

Step-4: Program the X-cells, "0" below $T_2$, and "1" above $T_2$.

Step-5: Extract the corresponding data stream, and use the XOR data processor to enhance the randomness of the TRNG.

With this method the raw data stream generated by the memory array and the X-cell has a population with equal number of A-cells and B-cells, and this in spite of a potential drift in temperature caused by the hot air blower of the hacker. The integrity of the TRNG is thereby protected.

4-2 Generalization of the TRNG Design

In this disclosure it is suggested that the TRNG can be generated by a physical device/memory array that generates physically unclonable functions. The method is applicable to any memory device as long as it is possible to identify a parameter $\mathcal{P}$ that can be tested to sort out the cells, and identify enough unstable X-cells. The algorithm presented Section 4-2 is generic, and applicable to the following examples:

Flash or EEPROM memory: Parameter $\mathcal{P}$ could be the time to charge the floating gate to get a particular threshold voltage of each flash cell, or the transconductance of the cell after programming.

DRAM memory: parameter could be the residual charge left in a cell after constant discharging time.

ReRAM memory: In addition to the Vset as presented in the disclosure, parameter $\mathcal{P}$ could be the Vreset (erase cycle), Roff (resistivity on the high resistance state), or Ron (resistivity on the low resistivity state).

SRAM memory: TRNG based on the X-cells that are not consistently switching as a clear "0" or a clear "1".

As suggested by FIG. 12 the method can be generalized to any data stream based on a random physical component and a parameter $\mathcal{P}$. If the physical component generates a data stream with a deviation from absolute randomness $\lambda_{in}$, it is possible to model the size f of XOR, as shown in Section 3-3, to meet a particular $\lambda_{out}$ objective.

4-3 Characteristics of the Method

The use of an XOR data processor in addition to the ternary state method of the Prior Applications has been discussed in this disclosure. As noted in Section 1-2, XOR is used as a cryptographic method to enhance randomness, and encrypt. The method disclosed herein includes the following:

The combination of the use of ternary states and the disclosed XOR data processor to enhance the randomness of the TRNG. The XOR data processor without the preliminary sorting of the X-cells is poorly effective.

Quantifying the level of randomization of a new method to generate RNG can be extremely challenging, if not impossible. The disclosed method is described with a way to quantify randomization. It is possible to predict with the probabilistic model the desirable size of f to reach a minimum $\lambda$. A straightforward algorithm can handle a XOR data processor varying f as a function of the incoming level of randomness of an incoming raw data stream to generate a TRNG with acceptable $\lambda$.

The disclosed method minimizes sensitivity to parameter drifts such as temperature or biasing conditions.

Other Characteristics/Features may Include the Following:

An initial data stream may be generated from a memory array by selecting only the cells that are instable, and subject to random effects. This data stream may thereafter be segmented in chunks of f bits, and all bits contained in each chunk may be submitted to an exclusive OR (XOR) operation involving the bits of chunks, to generate a new stream of bits with a higher level of randomness than the initial data stream.

In implementations the initial data stream is re-characterized, such that a new median is calculated every time a new random number is requested to compensate for any drift of the data stream due to effect such as, but not limited to: temperature changes; different biasing conditions in current, voltage and/or power; different measurement conditions; noise; any external interferences, including electro-magnetic interferences; and any combination thereof.

In implementations the length of the chunk of bits may be as low as two bits, and in other implementations the length may be very long.

The memory array may be, by non-limiting example, a resistive RAM, a flash memory, an EEPROM memory, a DRAM, an SRAM, a phase change memory, an MRAM memory, a magnetic memory, a hard disk of any type, and any combination thereof.

The data stream may be generated by a physical device, physical element, a physically unclonable function, and/or a nanocomponent of any type.

The length f of the chunk of bits may be increased when the level of randomness of the initial data stream is low, and/or it may be reduced when the level of randomness of the initial data stream is high. The length f of the chunk of bits may be increased when the expectation in the level of randomness of the final data stream is higher, and/or it may be reduced when the level of randomness of the final data stream is lower.

The data compiler for true random number generation and related methods may be made of and/or implemented using conventional computing element building blocks including discrete or combined logic components implemented using various hardware and/or software configurations. In places where the description above refers to particular implementations of data compilers and implementing components, sub-components, methods and sub-methods, it should be readily apparent that a number of modifications may be made without departing from the spirit thereof and that these implementations, implementing components, sub-components, methods and sub-methods may be applied to other data compilers.

What is claimed is:

1. A data compiler comprising:
   a physical device comprising a physical parameter, the physical parameter comprising at least three states;
   a data stream generated from the physical parameter, the data stream comprising a plurality of bits, each bit coded with one of a 0, a 1, and an X, the 0, the 1, and the X corresponding with one of the at least three states of the physical parameter, respectively; and
   an exclusive OR (XOR) data processor, the XOR data processor configured to randomize the at least three states of the data stream and output a randomized output data stream.

2. The data compiler of claim 1, wherein the physical device is one of a flash memory, electrically erasable programmable read-only memory (EEPROM), static random access memory (SRAM), dynamic random access memory (DRAM), random access memory (RAM), spin transfer-torque magnetic random access memory (STT-MRAM), and metal oxide resistive random access memory (ReRAM).

3. The data compiler of claim 1, wherein one of the at least three states of the physical parameter changes whenever a new measurement is made.

4. The data compiler of claim 1, wherein the XOR data processor is implemented by one of a general purpose processor and an application specific integrated circuit (ASIC).

5. The data compiler of claim 1, wherein the XOR data processor comprises three or more logic gates.

6. The data compiler of claim 5, further comprising a state machine coupled with the three or more logic gates and coupled with a secure processor.

7. A method of generating a true random number, the method comprising:
- providing a physical device, the physical device comprising a plurality of cells;
- sorting the plurality of cells based on a state of a physical parameter, $\mathcal{P}$, into one of a 0 state, a 1 state, and an X state;
- generating a stream of states from the states of the plurality of cells;
- creating a stream of random numbers from the stream of states;
- grouping the stream of random numbers into one or more chunks of f bits; and
- generating a stream of true random numbers through randomizing the one or more chunks of f bits using an exclusive OR (XOR) processor.

8. The method of claim 7, wherein the physical device is one of a flash memory, electrically erasable programmable read-only memory (EEPROM), static random access memory (SRAM), dynamic random access memory (DRAM), random access memory (RAM), spin transfer-torque magnetic random access memory (STT-MRAM), and metal oxide resistive random access memory (ReRAM).

9. The method of claim 7, wherein the stream of random numbers comprises $\{a_1, a_2, \ldots, a_i, \ldots a_n\}$.

10. The method of claim 9, wherein the one or more chunks of f bits comprises $\{a_{j1}, a_{j2}, \ldots, a_{ij}, \ldots, a_{jf}\}$ with f<n, where n is the number of bits in the stream of random bits.

11. The method of claim 10, wherein the stream of true random numbers comprises $\{c_1, c_2, \ldots, c_j, \ldots, c_m\}$ where $c_j = a_{j1} \oplus a_{j2} \oplus \ldots \oplus a_{ij} \oplus \ldots \oplus a_{jf}$ and n=m.f.

12. The data compiler of claim 7, wherein the state of the physical parameter changes whenever a new measurement is made.

13. The method of claim 7, wherein the XOR data processor is implemented by one of a general purpose processor and an application specific integrated circuit (ASIC).

14. The method of claim 7, wherein the XOR data processor comprises three or more logic gates.

15. The method of claim 7, further comprising a state machine coupled with the three or more logic gates and coupled with a secure processor.

16. A method for generating a true random number, the method comprising:
- providing a physical device, the physical device comprising a plurality of cells;
- sorting the plurality of cells based on a state of a physical parameter, $\mathcal{P}$, into one of a 0 state, a 1 state, and an X state, the X states comprising a desired level of randomness based on the physical parameter, $\mathcal{P}$, and a first threshold, $T_1$;
- retesting all X states against the physical parameter, $\mathcal{P}$;
- identifying a second threshold, $T_2$;
- changing the X states to one of 0 states and 1 states using the second threshold $T_2$;
- generating a stream of states from the states of the plurality of cells;
- extracting a data stream from the stream of states; and
- generating a stream of true random numbers through randomizing one or more chunks of f bits using an exclusive OR (XOR) processor.

17. The method of claim 16, wherein the physical device is one of a flash memory, electrically erasable programmable read-only memory (EEPROM), static random access memory (SRAM), dynamic random access memory (DRAM), random access memory (RAM), spin transfer-torque magnetic random access memory (STT-MRAM), and metal oxide resistive random access memory (ReRAM).

18. The method of claim 16, wherein at least one of the states of the physical parameter changes whenever a new measurement is made.

19. The method of claim 16, wherein the XOR data compiler processor is implemented by one of a general purpose processor and an application specific integrated circuit (ASIC).

20. The method of claim 16, wherein the XOR data processor comprises three or more logic gates.

* * * * *